(12) United States Patent
Kim

(10) Patent No.: US 6,949,422 B2
(45) Date of Patent: Sep. 27, 2005

(54) METHOD OF CRYSTALIZING AMORPHOUS SILICON FOR USE IN THIN FILM TRANSISTOR

(75) Inventor: Young-Joo Kim, Dae-gu (KR)

(73) Assignee: LG Philips LCD Co., Ltd., Seoul (KR)

( * ) Notice: Subject to any disclaimer, the term of this patent is extended or adjusted under 35 U.S.C. 154(b) by 59 days.

(21) Appl. No.: 10/746,019

(22) Filed: Dec. 23, 2003

(65) Prior Publication Data

US 2004/0137671 A1 Jul. 15, 2004

(30) Foreign Application Priority Data

Dec. 31, 2002 (KR) .................................... P2002-88403

(51) Int. Cl.⁷ .............................................. H01L 21/00
(52) U.S. Cl. ...................... 438/166; 438/486; 438/795
(58) Field of Search ............................. 438/151, 166, 438/482, 486, 487, 795

(56) References Cited

U.S. PATENT DOCUMENTS

| | | | |
|---|---|---|---|
| 6,322,625 B2 | | 11/2001 | Im |
| 6,355,509 B1 | * | 3/2002 | Yamazaki ................... 438/149 |
| 6,368,945 B1 | | 4/2002 | Im |
| 2003/0022467 A1 | * | 1/2003 | Zang et al. ................. 438/479 |
| 2003/0094611 A1 | * | 5/2003 | Hayajawa .................... 257/49 |

FOREIGN PATENT DOCUMENTS

| | | |
|---|---|---|
| KR | 2001-0004129 | 1/2001 |
| KR | 2002-0054609 | 7/2002 |
| KR | 2002-0076793 | 10/2002 |
| WO | WO 97/45827 | 12/1997 |

OTHER PUBLICATIONS

Copy of Office Action dated Jan. 24, 2005 for Korean Patent Application No. 10-2002-0088403.

* cited by examiner

*Primary Examiner*—Tuan H. Nguyen
(74) *Attorney, Agent, or Firm*—Brinks Hofer Gilson & Lione

(57) ABSTRACT

Sequential lateral solidification (SLS) crystallization of amorphous silicon uses a mask having light transmitting portions. A method of crystallizing an amorphous silicon film using the mask includes forming an amorphous silicon layer over a substrate; forming a metal layer on the amorphous silicon layer; patterning the metal layer to expose a portion of the amorphous silicon layer in a TFT area where a thin film transistor is formed; disposing the mask over the portion of the amorphous silicon layer exposed by the metal layer; and irradiating the portion of the amorphous silicon layer exposed by the metal layer using a laser beam that passes through the light transmitting portions of the mask such that the portion of the amorphous silicon layer is crystallized and laterally growing grains are formed in grain regions.

41 Claims, 30 Drawing Sheets

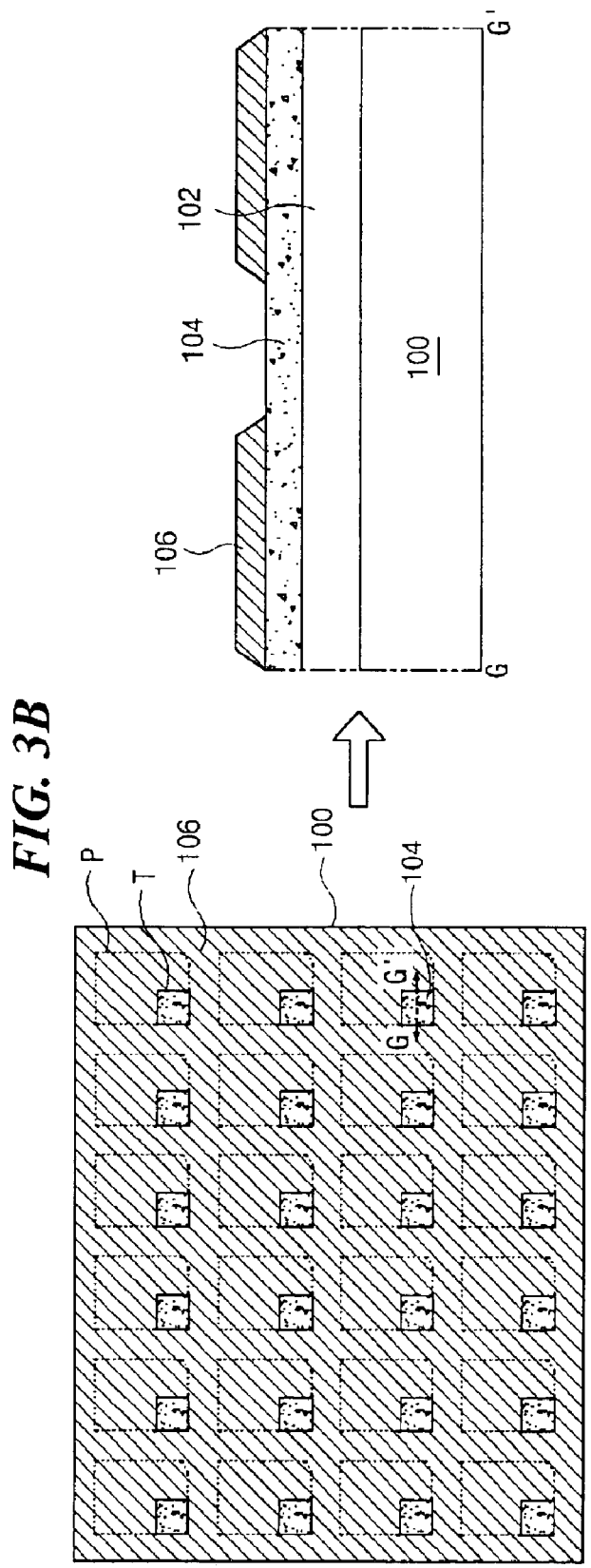

METHOD OF CRYSTALIZING AMORPHOUS SILICON FOR USE IN THIN FILM TRANSISTOR

RELATED APPLICATIONS

This application claims the benefit of Korean Patent Application No. 2002-0088403, filed in Korea on Dec. 31, 2002, and which is hereby incorporated by reference as it is fully set forth herein.

BACKGROUND

The present invention relates to a method of crystallizing an amorphous silicon film, and more particularly, to a crystallization method using sequential lateral solidification (SLS).

Polycrystalline silicon (p-Si) and amorphous silicon (a-Si) are often used as active layer materials for thin film transistors (TFTs) in liquid crystal display (LCD) devices. Since amorphous silicon (a-Si) can be deposited at a low temperature to form a thin film on a glass substrate, amorphous silicon (a-Si) is commonly used in switching devices of liquid crystal displays (LCDs). Unfortunately, amorphous silicon (a-Si) TFTs have relatively slow display response times that limit their suitability for large area LCD.

In contrast, polycrystalline silicon TFTs provide much faster display response times. Thus, polycrystalline silicon (p-Si) is well suited for use in large LCD devices, such as laptop computers and wall-mounted television sets. Such applications often require TFTs having a field effect mobility greater than 30 $cm^2/Vs$ together with low leakage current.

A polycrystalline silicon film is composed of crystal grains having grain boundaries. The larger the grains and the more regular the grains boundaries the better the field effect mobility. Thus, a silicon crystallization method that produces large grains, ideally a single crystal, would be useful.

One method of crystallizing amorphous silicon into polycrystalline silicon is sequential lateral solidification (SLS). SLS crystallization uses the fact that silicon grains tend to grow laterally from the interfaces between liquid and solid silicon such that the resulting grain boundaries are perpendicular to the interfaces. With SLS, amorphous silicon is crystallized using a laser beam having a magnitude and a relative motion that melts amorphous silicon such that the melted silicon forms laterally grown silicon grains upon re-crystallization.

FIG. 1A is a schematic configuration of a conventional sequential lateral solidification (SLS) apparatus, while FIG. 1B shows a plan view of a conventional mask 38 that is used in the apparatus of FIG. 1A. In FIG. 1A, the SLS apparatus 32 includes a laser generator 36, a mask 38, a condenser lens 40, and an objective lens 42. The laser generator 36 generates and emits a laser beam 34. The intensity of the laser beam 34 is adjusted by an attenuator (not shown) in the path of the laser beam 34. The laser beam 34 is then condensed by the condenser lens 40 and is then directed onto the mask 38.

Specifically referencing FIG. 1B, The mask 38 includes a plurality of light transmitting areas A through which the laser beam 34 passes, and light absorptive areas B that absorb the laser beam 34. The width of each light transmitting area A effectively defines the grain size of the crystallized silicon produced by a first laser irradiation. Furthermore, the distance between each light transmitting area A defines the size of the lateral grains growth of amorphous silicon crystallized by the SLS method. Referring now to FIG. 1A, the objective lens 42 is arranged below the mask and reduces the shape of the laser beam that passes through the mask 38.

Still referring to FIG. 1A, an X-Y stage 46 is arranged adjacent to the objective lens 42. The X-Y stage 46, which is movable in two orthogonal axial directions, includes an x-axial direction drive unit for driving the x-axis stage and a y-axial direction drive unit for driving the y-axis stage. A substrate 44 is placed on the X-Y stage 46 so as to receive light from the objective lens 42. Although not shown in FIG. 1A, it should be understood that an amorphous silicon film is on the substrate 44, thereby defining a sample substrate.

To use the conventional SLS apparatus, the laser generator 36 and the mask 38 are typically fixed in a predetermined position while the X-Y stage 46 moves the amorphous silicon film on the sample substrate 44 in the x-axial and/or y-axial direction. Alternatively, the X-Y stage 46 may be fixed while the mask 38 moves to crystallize the amorphous silicon film on the sample substrate 44.

FIGS. 2A–2C are cross sectional views showing one block of an amorphous silicon film being crystallized using a conventional SLS method. In the illustrated crystallization, it should be understood that the mask (see FIGS. 1A and 1B) has three light transmitting areas.

Before performing SLS crystallization, a buffer layer 12 is typically formed on a substrate 10, as shown in FIG. 2A, and then, an amorphous silicon film 14 is deposited on the buffer layer 12. Thereafter, the amorphous silicon will be crystallized as described above using the SLS apparatus. The buffer layer 12 is usually formed of an inorganic material, such as silicon nitride ($SiN_x$) or silicon oxide ($SiO_2$). The buffer layer 12 functions as preventing a diffusion of impurities from the substrate 10 to the amorphous silicon film 14 during a later performed laser irradiation.

The amorphous silicon film 14 is usually deposited on the buffer layer 12 using chemical vapor deposition (CVD). Unfortunately, that method produces amorphous silicon with a lot of hydrogen. To reduce the hydrogen content, the amorphous silicon film 14 is typically thermal-treated, which causes de-hydrogenation, which results in a smoother surface on the crystalline silicon film. If the de-hydrogenation is not performed, the surface of the crystalline silicon film is rough and the electrical characteristics of the crystalline silicon film are degraded.

Now in FIG. 2B, a mask 38 having light transmitting areas A and light absorptive areas B is located above the amorphous silicon film 14, and then laser irradiation is performed through the mask 38. Therefore, the amorphous silicon film 14 is partially melted so that it includes melt regions C and non-melt regions D. The melt regions C correspond to the light transmitting areas A of the mask, and the non-melt regions D correspond to the light absorptive areas B.

Next in FIG. 2C, melted silicon of the melt region C is rapidly crystallized, so that grains 60a and 60b laterally grow from the interface between the melt region C and the non-melt region D. Namely, lateral grain growth of the grains 60a and 60b proceeds from the un-melted regions D to the fully melted regions C. The grains 60a laterally growing on left and the grains 60b laterally growing on right collide with each other in a center of the melt region C. Therefore, each melt region C has a first grain region E and a second grain region F after the first laser irradiation.

Lateral growth stops when: (1) grains grown from interfaces collide near the center of the melted region C; or (2) polycrystalline silicon particles are formed in the center of the melted regions C as the melted silicon region solidifies sufficiently to generate solidification nuclei.

If the width of the light transmitting areas A (see FIG. 1B) is equal or less than the maximum lateral growth of the grain, the grains 60a and 60b collide with each other in the center of the region C and then stop growing. Alternatively, if the width of the light transmitting areas A (see FIG. 1B) is twice as large as the maximum lateral growth of the grain, the width of the melted silicon regions C is also twice as large as the maximum lateral growth length of the grain. Therefore, the lateral grain growth stops when the polycrystalline silicon particles are formed in the center of the region C. Such polycrystalline silicon particles act as solidification nuclei in a subsequent crystallization step.

FIGS. 2D–2F are plan views showing the lateral grain growth using sequential lateral solidification (SLS) after the first irradiation.

Especially, FIG. 2D is a plan view of FIG. 2C. As described above, each of the melted regions C is divided into the first and second grain regions E and F after the first laser irradiation. Furthermore, grain boundaries of the first and second regions E and F tend to form perpendicular to the interface between the first and second regions E and F.

FIG. 2E illustrates crystallizing the silicon film of FIG. 2D using a second laser beam irradiation. After the first laser beam irradiation, the X-Y stage or the mask 38 moves in a direction along the lateral grain growth of the grains 60a or 60b (in FIG. 2C), i.e., in the X direction, by a distance that is no more than the maximum length of the lateral grain growth. Then, a second laser beam irradiation is conducted.

In order to grow the grains, the mask 38 moves (relative to the amorphous silicon) to a position where the light transmitting area(s) A exposes a portion of the first grain region E, the border between the first and second grain regions E and F, the second grain region F, and a portion of the amorphous silicon region. Namely, the light transmitting areas A should overlap the borders between the first and second grain regions E and F and between the second grain region and the amorphous silicon region. That is because a lot of defects, such as dislocation and lattice defects, occur around the borders. Namely, such defects are generated at the edges of the laser beam.

After moving the X-Y stage or the mask 38, the second laser beam irradiation is conducted to grow grains formed by the first laser beam irradiation, thereby resulting in a third grain regions G as shown in FIG. 2E. As a result of the second laser beam irradiation, the grains 60a on the left grow until they collide with grains growing right to left in the third grain region G.

Accordingly, by repeating the above-mentioned foregoing steps of melting and crystallizing, one block of the amorphous silicon film is crystallized to form large grains 60c as shown in FIG. 2F. The above-mentioned crystallization processes conducted within one block are repeated block by block across the amorphous silicon film. Therefore, the large size amorphous silicon film is converted into a crystalline silicon film. While generally successful, the conventional SLS method described above has disadvantages.

After completing the crystalline silicon film, an optical unevenness is produced in portions where the laser beams are overlapped between the laser beam irradiations. That is because the thermal energy of the laser beam affects the underlying buffer layer (reference number 12 of FIG. 2A–2C). Therefore, a new method of crystallizing amorphous silicon using sequential lateral solidification (SLS) is required for improving manufacturing efficiency.

BRIEF SUMMARY

Accordingly, the present invention is directed to a method of crystallizing an amorphous silicon film using a sequential lateral solidification (SLS) that substantially obviates one or more of the problems due to limitations and disadvantages of the related art.

An advantage of the present invention is to provide a sequential lateral solidification (SLS) method which uses an additional metal layer for the TFTs and driving circuits such that it stabilizes crystallizing an amorphous silicon film and obtains a productivity increase.

Another advantage of the present invention is to provide a method of crystallizing an amorphous silicon layer with increased manufacturing yield using the improved SLS method.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method of crystallizing an amorphous silicon film using a mask having light absorptive portions and light transmitting portions is disclosed. The method includes forming an amorphous silicon layer over a substrate; forming a metal layer on the amorphous silicon layer; patterning the metal layer to expose a portion of the amorphous silicon layer in a TFT area where a thin film transistor is formed; disposing the mask over the portion of the amorphous silicon layer exposed by the metal layer; irradiating the portion of the amorphous silicon layer exposed by the metal layer using a laser beam that passes through the light transmitting portions of the mask such that the portion of the amorphous silicon layer is moving the mask in an X-axial direction by a distance less than a maximum length of the laterally growing grains such that the light transmitting portions expose a portion of the first grain region, an interface between the first and second grain regions, the second grain region and a new amorphous silicon region; performing a laser beam irradiation on the regions exposed by the light transmitting portions of the mask such that a first grains in the first grain regions grow until the first grains collide with oppositely growing grains; and repeating said moving the mask and said performing the laser beam irradiation such that the portion of the amorphous silicon layer exposed by the metal layer is completely crystallized.

In another aspect of the present invention, a method of forming a polycrystalline silicon thin film transistor includes forming an amorphous silicon layer over a substrate; forming a metal layer on the amorphous silicon layer; patterning the metal layer to expose a portion of the amorphous silicon layer in a TFT area where the polycrystalline silicon thin film transistor is formed; disposing the mask over the portion of the amorphous silicon layer exposed by the metal layer, the mask having light transmitting portions and light absorptive portions; irradiating the portion of the amorphous silicon layer exposed by the metal layer using a laser beam that passes through the light transmitting portions of the mask such that the portion of the amorphous silicon layer is crystallized and laterally growing grains are formed; removing the metal layer after crystallizing the portion of the amorphous silicon layer; patterning the amorphous silicon layer except the portion crystallized such that a crystalline silicon layer is formed to correspond to the polycrystalline silicon thin film transistor, wherein the crystalline silicon layer includes an active region in a middle and source and drain regions on both sides of the active region; forming a gate insulating layer on the crystalline silicon layer; forming a gate electrode on the gate insulating layer above the active region; doping impurities on the source and drain regions of the crystalline silicon layer using the gate electrode as an ion stopper; forming an interlayer over an entire of the substrate to cover the gate electrode and the source and drain region where the impurities are doped, the interlayer having first and second contact holes exposing the source and drain region, respectively; and forming source and drain electrodes, wherein the source electrode contacts the source region through the first contact hole and the drain electrode contacts the drain region through the second contact hole.

It is to be understood that both the foregoing general description and the following detailed description are exemplary and explanatory and are intended to provide further explanation of the invention as claimed.

BRIEF DESCRIPTION OF THE DRAWING

FIGS. 3A–3D are plan views and corresponding cross-sectional views which illustrate the process steps of crystallizing an amorphous silicon film according the present invention.

FIGS. 4E–4G are plan views showing the lateral grain growth using the SLS method after the first irradiation according to another exemplary of the present invention.

DETAILED DESCRIPTION OF THE DRAWINGS AND THE PRESENTLY PREFERRED EMBODIMENTS

Reference will now be made in detail to the preferred embodiments of the present invention, examples of which are shown in the accompanying drawings. Wherever possible, similar reference numbers will be used throughout the drawings to refer to the same or like parts.

FIGS. 3A–3D are plan views and corresponding cross-sectional views which illustrate the process steps of crystallizing an amorphous silicon film according the present invention.

Figure 1A:
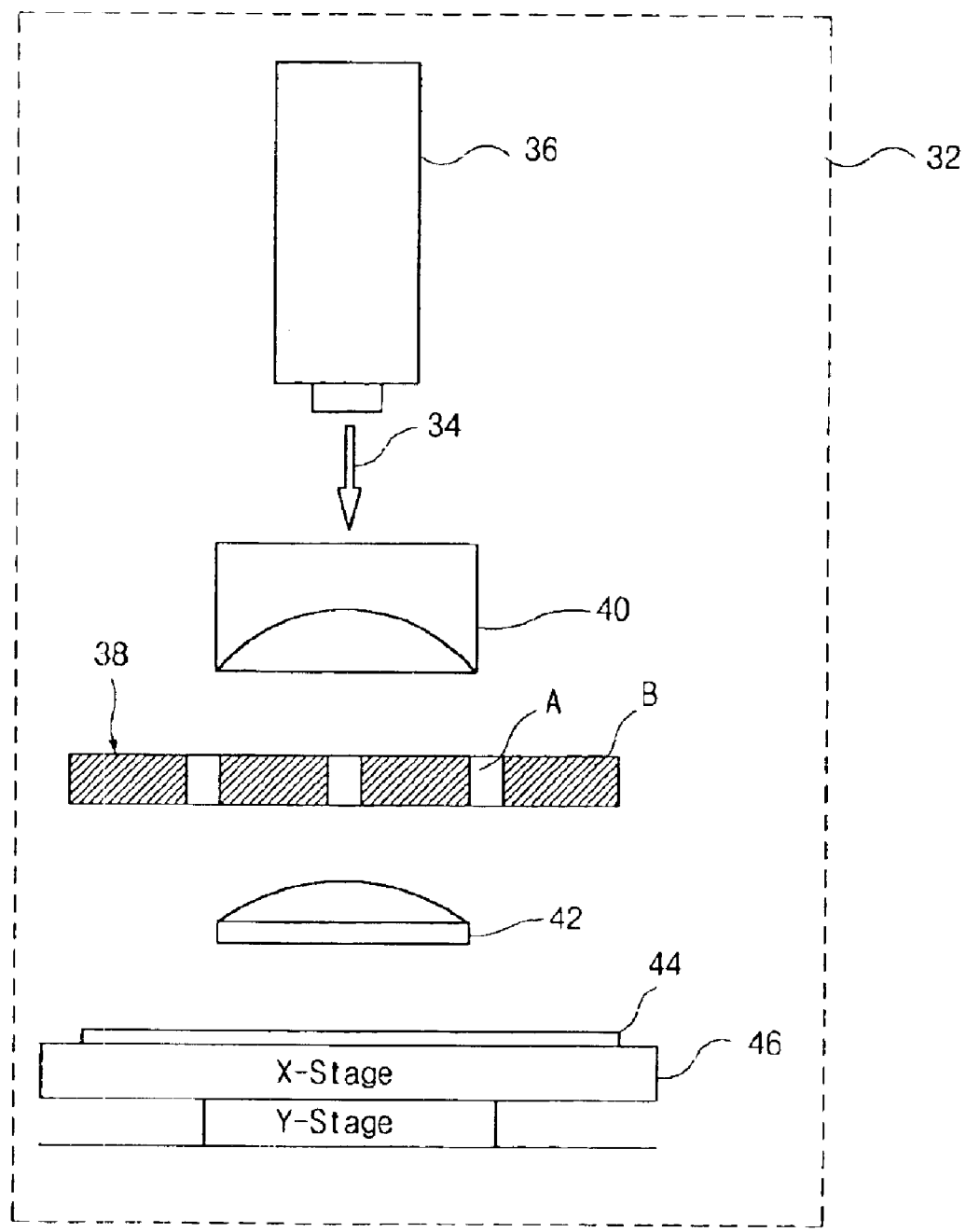
FIG. 1A is a schematic configuration of a sequential lateral solidification (SLS) apparatus according to the conventional art.
Figure 1B:
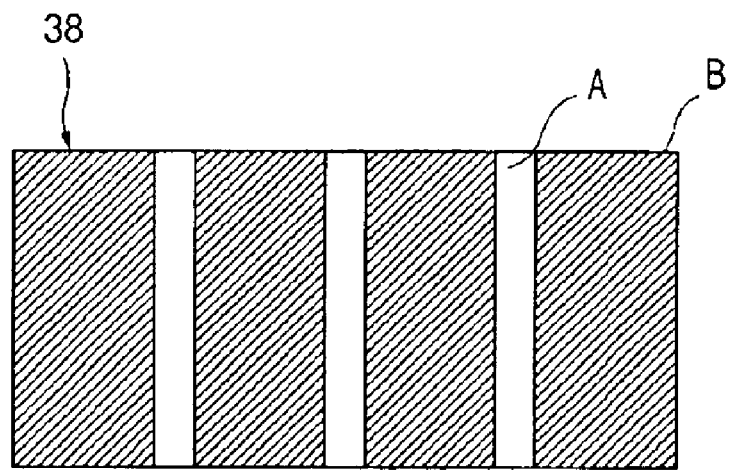
FIG. 1B is a plan view showing a mask used in the apparatus.
Figure 2A:
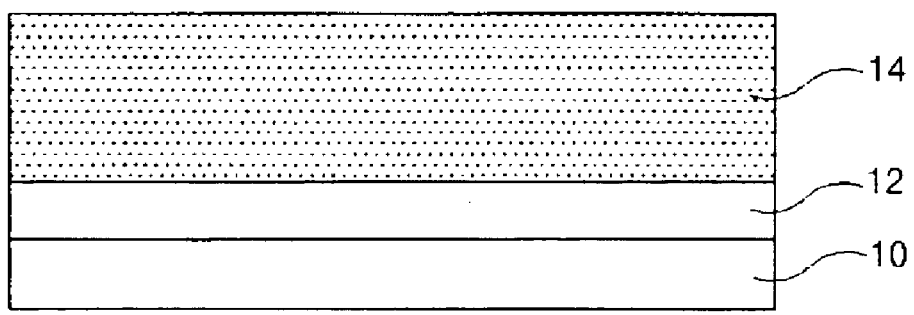
FIGS. 2A–2C are cross sectional views showing one block of an amorphous silicon film being crystallized using a conventional SLS method.
Figure 2B:
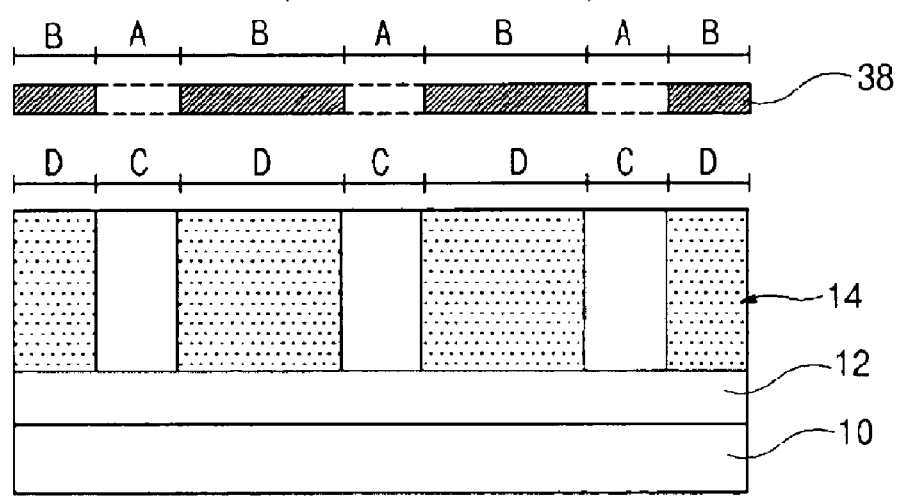
Figure 2C:
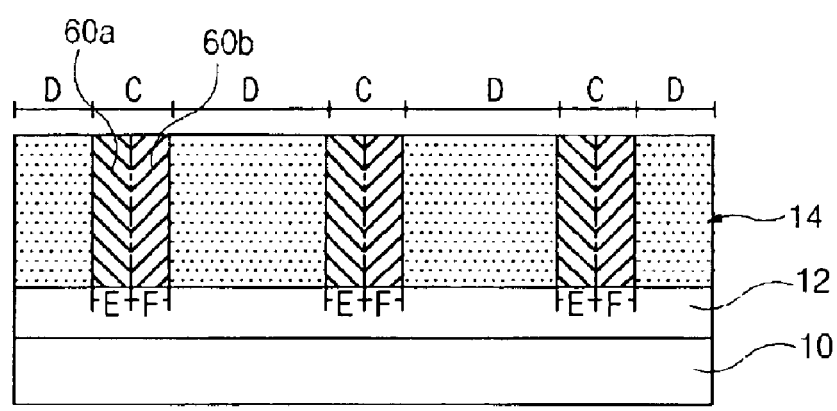
Figure 2D:
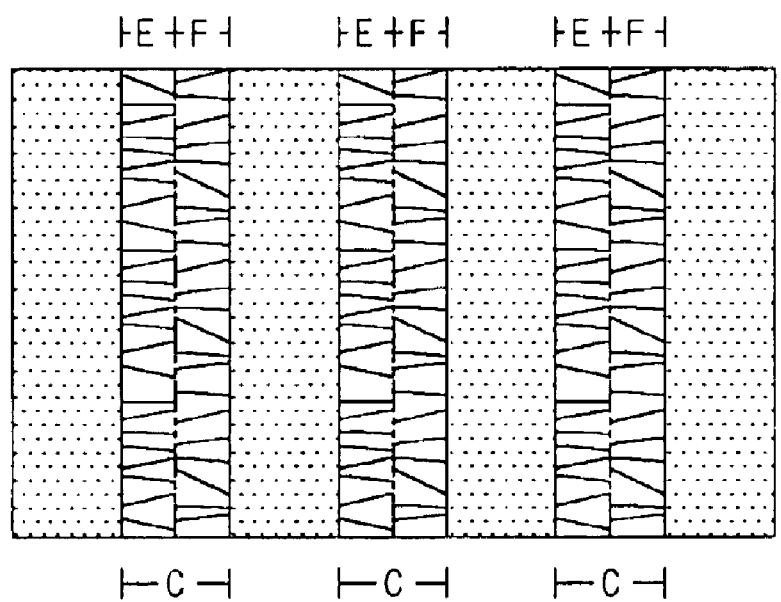
FIGS. 2D–2F are plan views showing the lateral grain growth using the conventional sequential lateral solidification (SLS) method after the first irradiation.
Figure 2E:
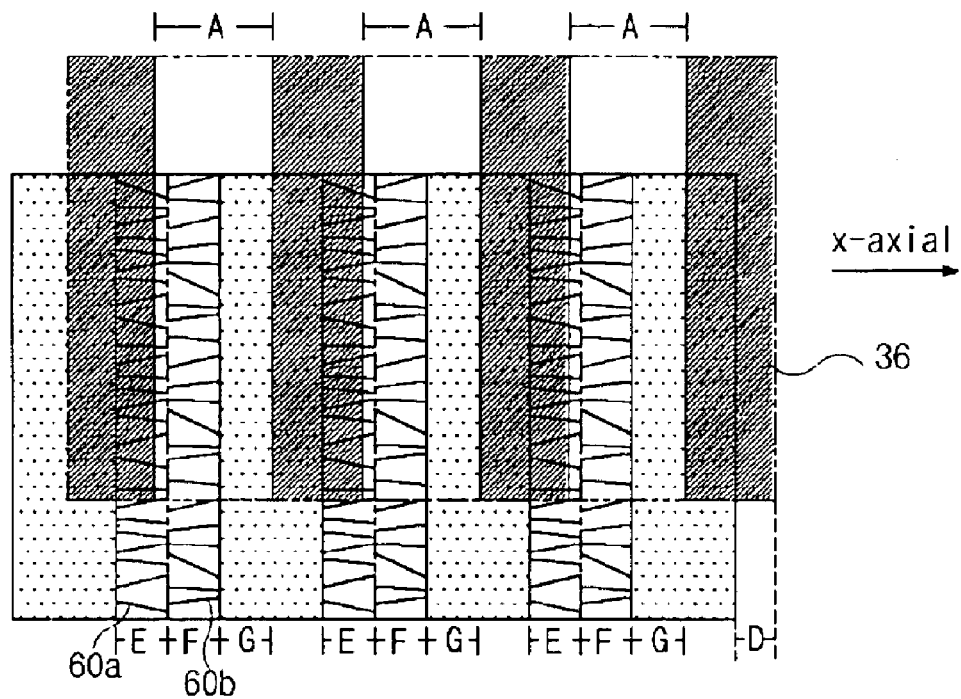
Figure 2F:
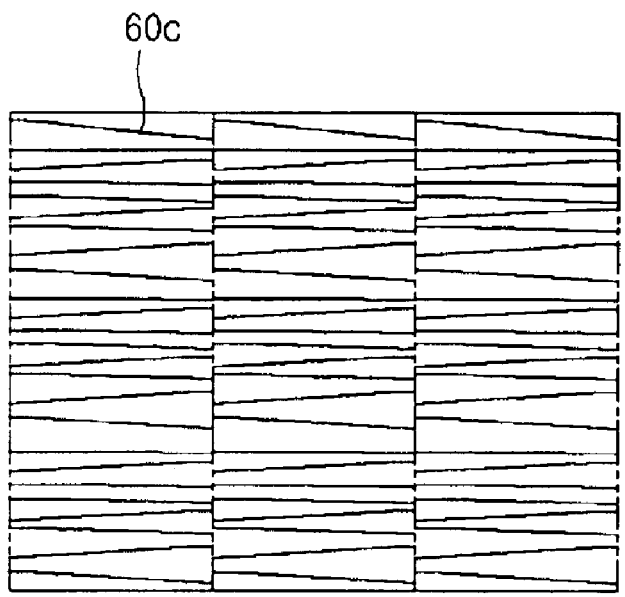
Figure 3A:
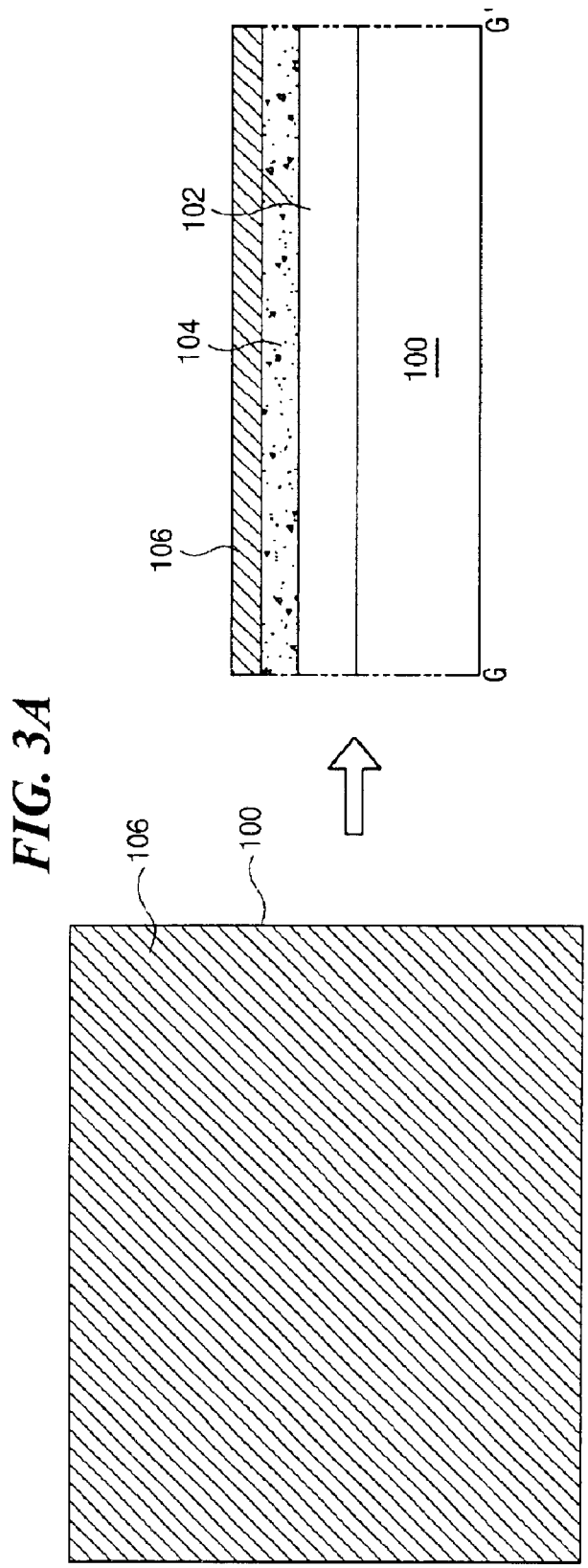

In FIG. 3A, a buffer layer 102 is first formed on a substrate 100. The buffer layer 102 is an inorganic material selected from a group consisting of silicon nitride ($SiN_x$) and silicon oxide ($SiO_2$), and acts to prevent a diffusion of impurities from the substrate 100 to the later formed amorphous silicon film. After forming the buffer layer 102, an amorphous silicon (a-Si:H) layer 104 is formed on the buffer layer 102. The amorphous silicon layer 104 is usually deposited on the buffer layer 102 using chemical vapor deposition (CVD). Unfortunately, that method produces amorphous silicon with a lot of hydrogen. To reduce the hydrogen content, the amorphous silicon layer 104 is typically thermal-treated, which causes de-hydrogenation, which results in a smoother surface on the crystalline silicon film. If the de-hydrogenation is not performed, the surface of the crystalline silicon film is rough and the electrical characteristics of the crystalline silicon film are degraded.

After forming the amorphous silicon layer 104, a metal layer 106 is formed on the amorphous silicon layer 104. The metal layer 106 may have a high melting point and include molybdenum (Mo).

Next in FIG. 3B, a plurality of pixel regions P and a plurality of TFT regions T are defined in the substrate 100 having the buffer layer 102, the amorphous silicon layer 104 and the metal layer 106 thereon. Each TFT region T is disposed at the corner of each pixel region P. Thereafter, the metal layer 106 is patterned to expose portions of the amorphous silicon layer 104 within the TFT regions T, thereby forming openings each corresponding to each TFT region T.

Figure 3C:
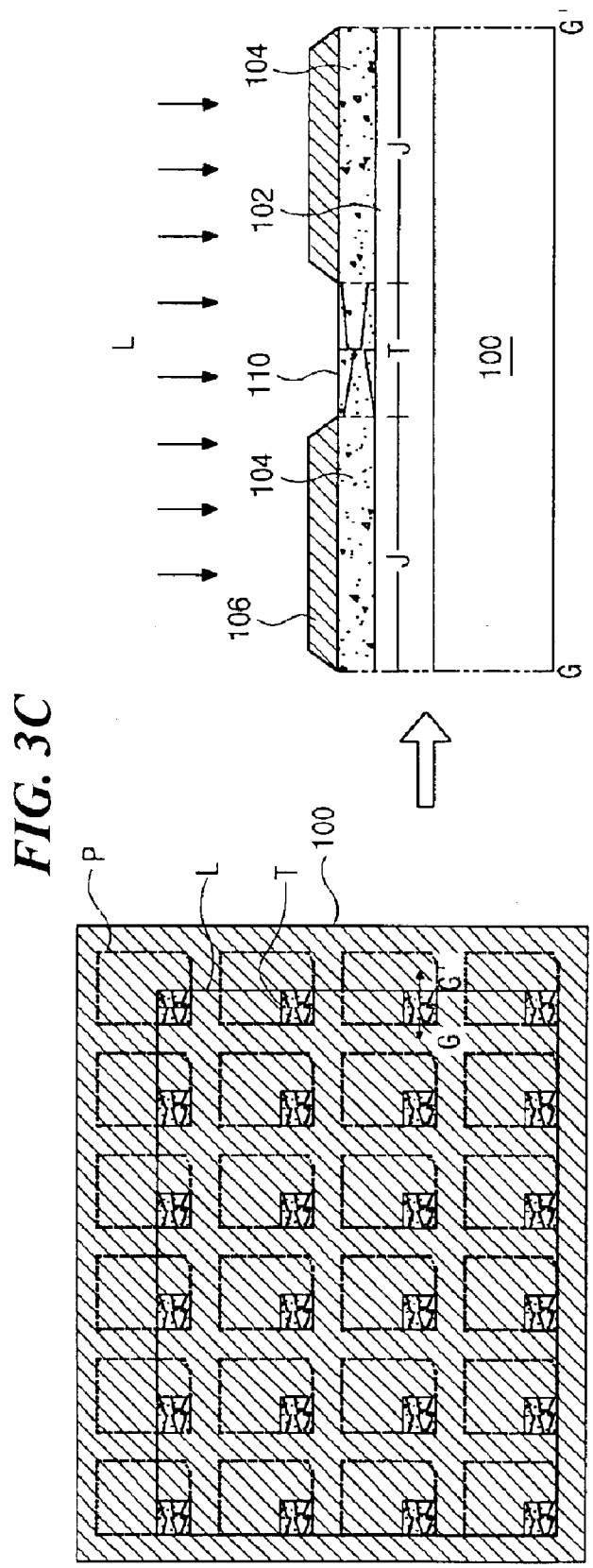

In FIG. 3C, a first laser beam irradiation is performed all over the substrate 100 having the patterned metal layer 106. Therefore, exposed portions T of the amorphous silicon film 104 are completely melted and then crystallized. Namely, the exposed portions M of the silicon layer 104 become crystalline regions that have grains 110. The non-exposed portion J of the silicon layer 104 still remains in the amorphous phase because the metal layer 106 blocks the laser beam L. Since the laser beam L does not irradiate the non-exposed portions of the amorphous silicon layer 104, the portions J underlying the metal layer 106 are not crystallized.

Figure 3D:
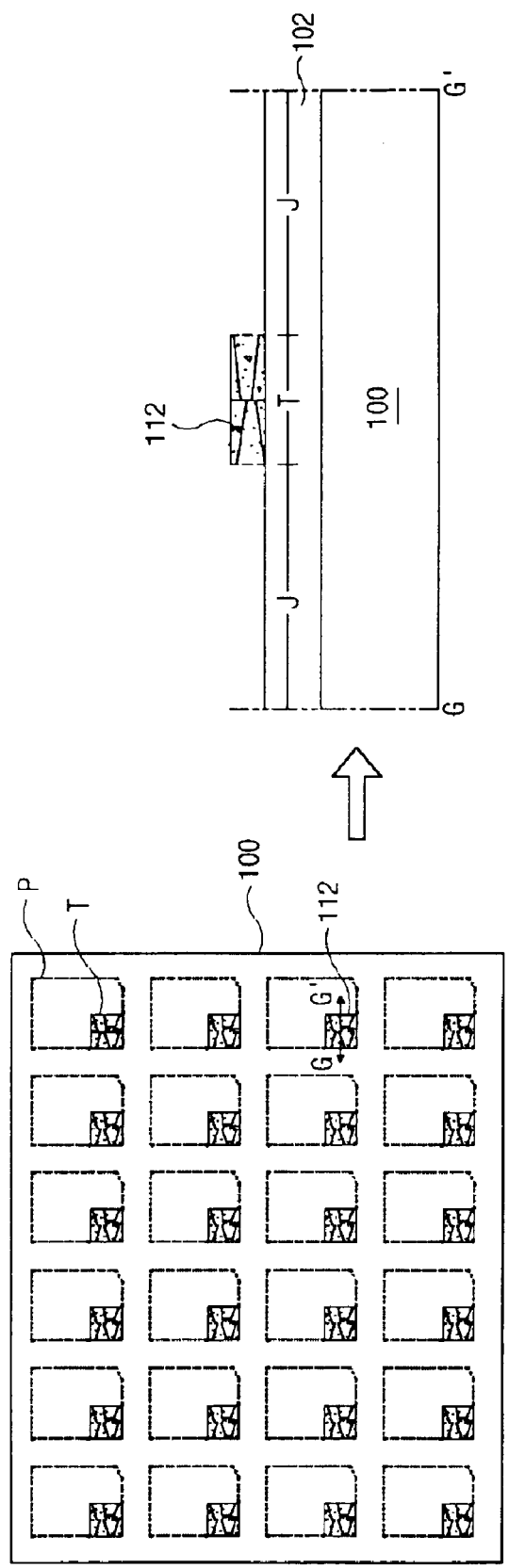

As shown in FIG. 3D, the metal layer 106 is removed from the partially-crystallized silicon layer 104 and then the partially-crystallized silicon layer 104 is patterned. Thus, only the crystalline silicon layers 112 remain on the buffer layer 102. The non-crystallized portions J are completely removed after patterning the partially-crystallized silicon layer 104. Each of the crystalline silicon layers 112 is located corresponding to the TFT region T, so that each crystalline silicon layer 112 is used as an active layer in the thin film transistor (TFT).

FIGS. 4A–4D are cross-sectional views illustrating in detail the crystallization process step of FIG. 3C.

Figure 4A:
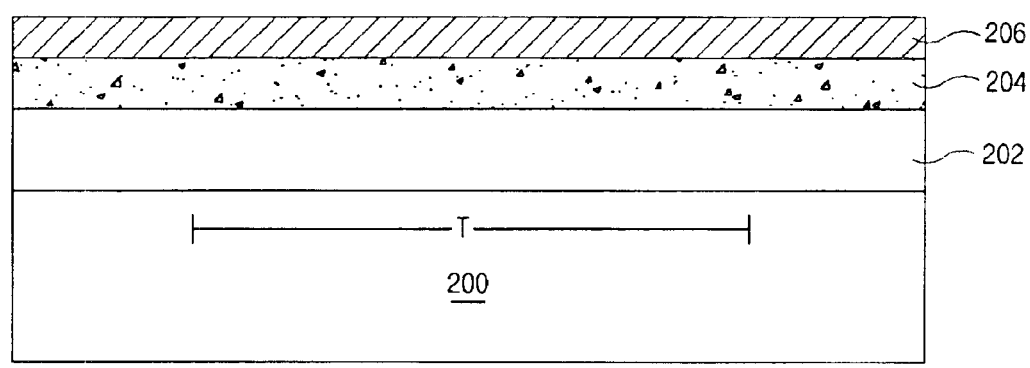
FIGS. 4A–4D are cross-sectional views illustrating in detail the crystallization process step.

In FIG. 4A, a buffer layer 202 is formed on a substrate 200. The buffer layer 202 is an inorganic material selected from silicon nitride ($SiN_x$) and silicon oxide ($SiO_2$), and acts to prevent diffusion of impurities from the substrate 200 to the later formed amorphous silicon film. An amorphous silicon (a-Si:H) layer 204 is formed on the buffer layer 202. The amorphous silicon layer 204 is usually deposited on the buffer layer 202 using chemical vapor deposition (CVD). Unfortunately, that method produces amorphous silicon with a lot of hydrogen. To reduce the hydrogen content, the amorphous silicon layer 204 is typically thermal-treated, which causes de-hydrogenation, which results in a smoother surface on the crystalline silicon film. If the de-hydrogenation is not performed, the surface of the crystalline silicon film is rough and the electrical characteristics of the crystalline silicon film are degraded.

After forming the amorphous silicon layer 204, a metal layer 206 is formed on the amorphous silicon layer 204. The metal layer 206 should have a high melting point, higher than the melting point of silicon or other semiconductor being processed, so that the metal will stand up to the processing temperatures without melting. Such a metal will generally include molybdenum (Mo) or a molybdenum alloy.

Figure 4B:
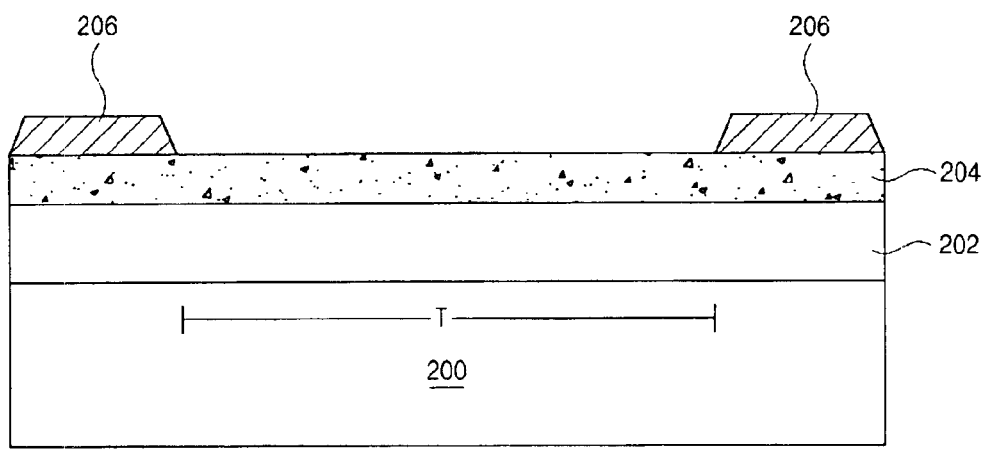

Next in FIG. 4B, the metal layer 206 is patterned to expose a portion of the amorphous silicon layer 204 which corresponds to a thin film transistor (TFT) region T.

Figure 4C:
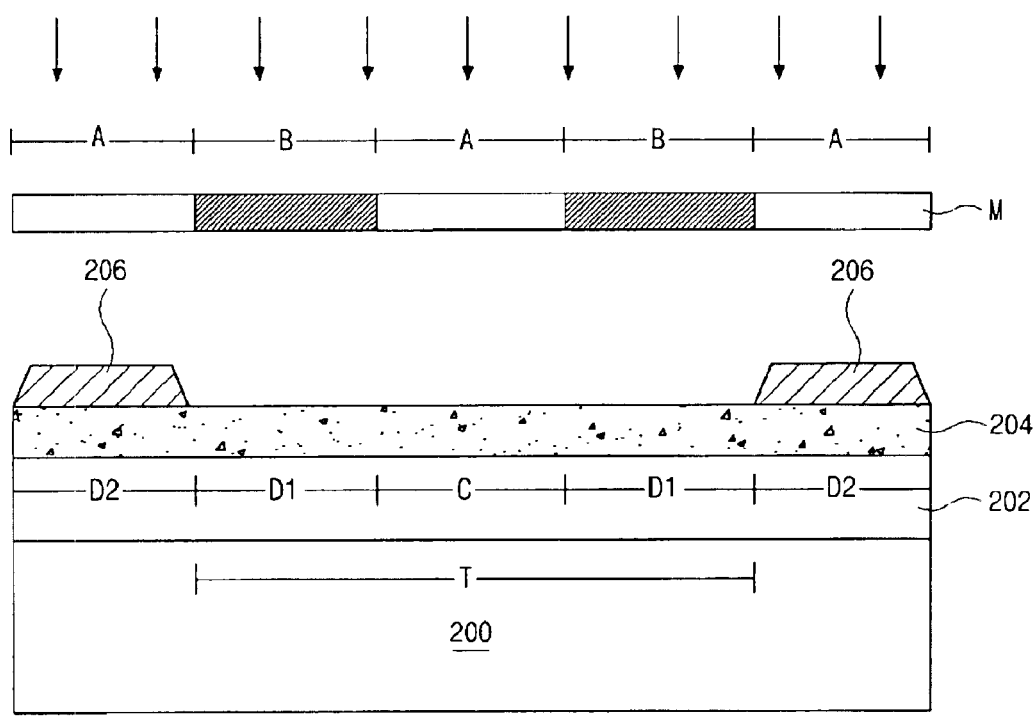

In FIG. 4C, a mask M having light transmitting areas A and light absorptive areas B is located over the patterned metal layer 206. And then a first laser beam irradiation is performed through the mask M. The laser beam passing through the mask M melts a portion C of the amorphous silicon layer 204 which corresponds in position to the light transmitting area A of the mask M. Furthermore, since the laser beam is blocked by the light absorptive areas B and by the metal layer 206, portions D1 and D2 corresponding to the light absorptive areas B and the metal layer 206, respectively, are not melted and crystallized. Thus, after the first laser beam irradiation, the silicon layer 204 includes the completely melt region C and first and second non-melt regions D1 and D2. The completely melt region C becomes crystallized, and the non-melt regions D1 and D2 remain as amorphous silicon as they were.

Figure 4D:
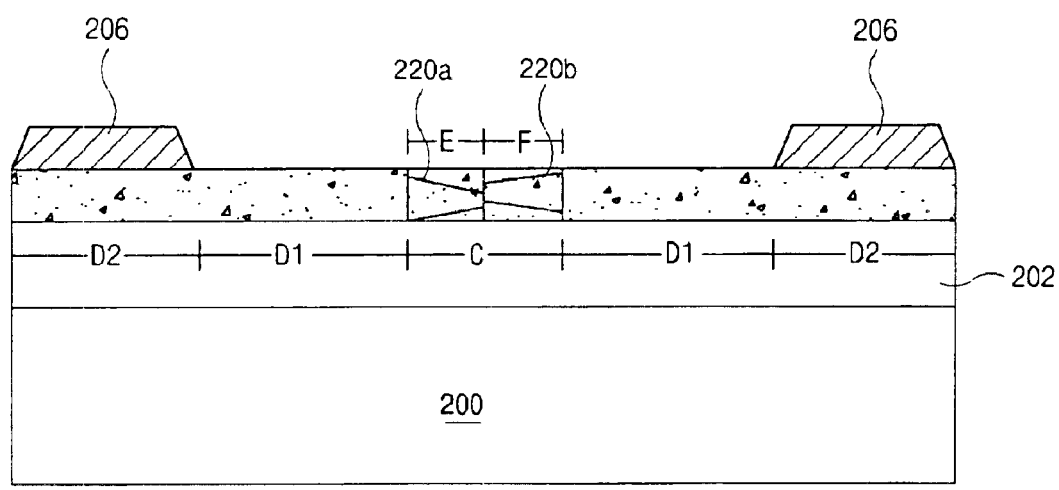

Next in FIG. 4D, the completely melt region C of the silicon layer 204 is rapidly crystallized, so that grains 220a and 220b laterally grow. Namely, lateral grain growth of the grains 220a and 220b proceeds from the first non-melt regions D1 to the fully melt region C. At this time, the non-melt regions D1 act as seeds for crystallization. The first grains 220a laterally growing on left and the second grains 220b laterally growing on right collide with each other in a center of the melt region C. Therefore, each melt region C has a first grain region E and a second grain region F after the first laser irradiation.

Figure 4E:
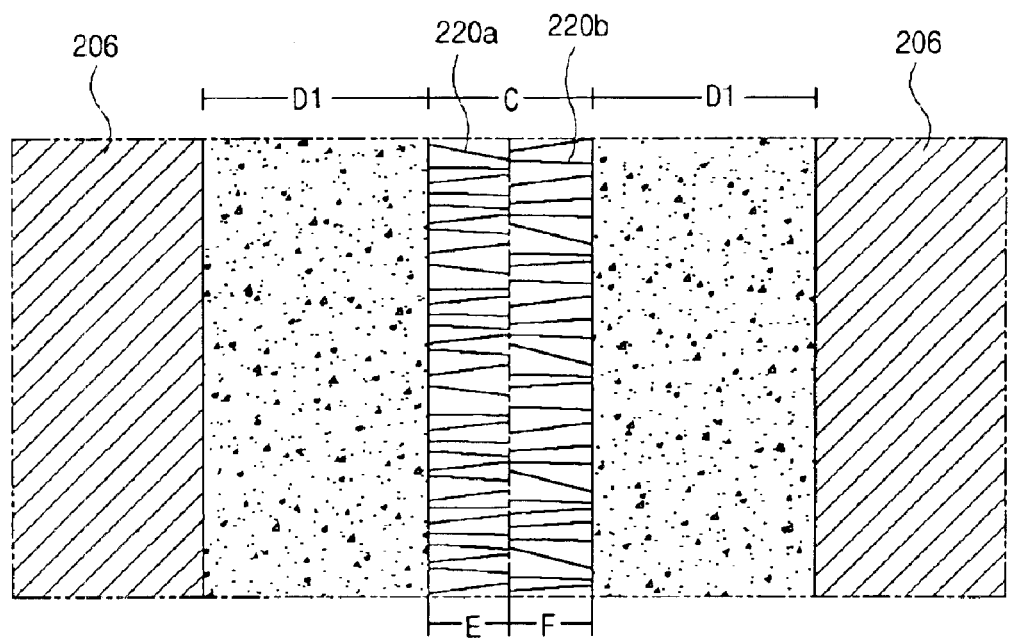
FIGS. 4E–4G are plan views showing the lateral grain growth using the SLS method after the first irradiation.
Figure 4F:
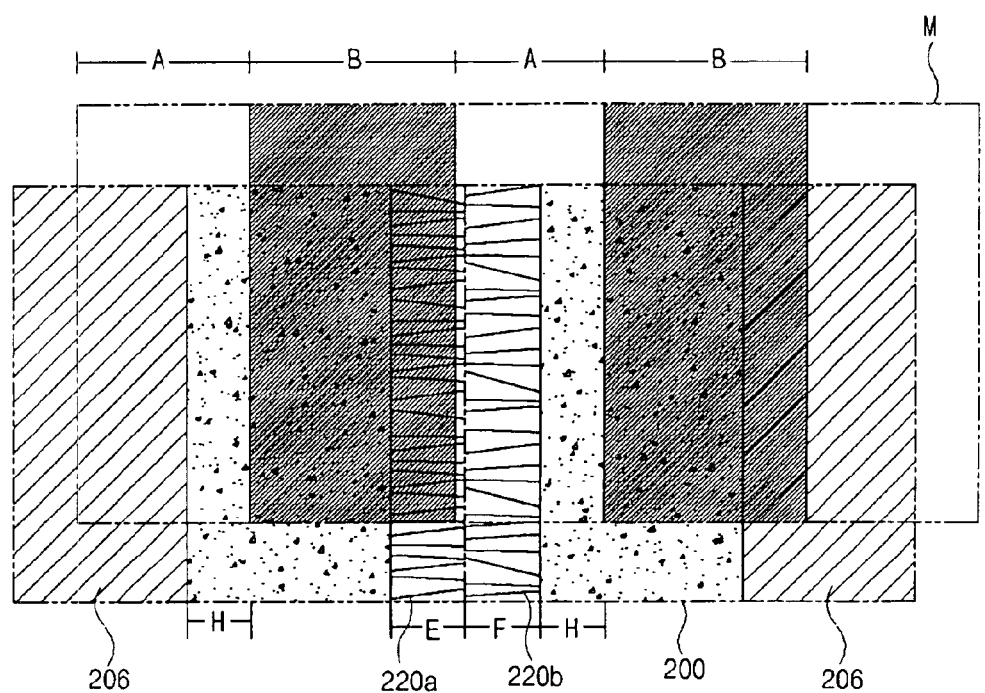
Figure 4G:
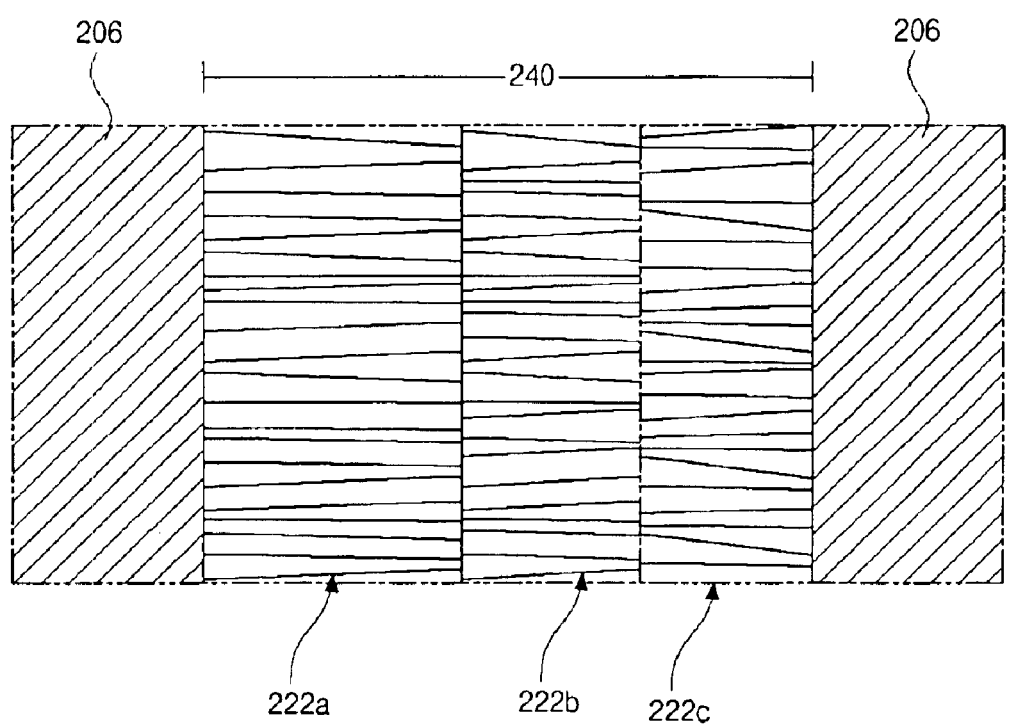

FIGS. 4E–4G are plan views showing the lateral grain growth using the SLS method after the first irradiation of FIGS. 4A–4D according to the present invention.

FIG. 4E is a plan view of FIG. 4D. As described above, the melt regions C is divided into the first and second grain regions E and F after the first laser irradiation, and the first and second grain regions E and F have the first and second grains 220a and 220b, respectively, growing from left to right and right to left. Furthermore, grain boundaries of the first and second regions E and F tend to form perpendicular to the interface between the melt region C and the first non-melt regions D1.

FIG. 4F illustrates a second laser beam irradiation. After the first laser beam irradiation, the mask M or the substrate 200 moves in a direction along the lateral grain growth of the grains 220a or 220b, i.e., in the X direction, by a distance that is no more than the length of the laterally growing grains 220a. Then, a second laser beam irradiation is conducted.

In order to grow the grains, the mask M moves (relative to the amorphous silicon) to a position where the light transmitting area(s) A exposes a portion of the first grain region E, the border between the first and second grain regions E and F, the second grain region F, and a new amorphous silicon portion H. Those irradiated portions are melted and then rapidly crystallized, so that the first grains 220a laterally grow until they collide with the oppositely growing grains.

Accordingly, by repeating the above-mentioned foregoing steps of melting and crystallizing using the mask M and the metal layer 206, the amorphous silicon exposed by the metal layer 206 is fully crystallized as shown in FIG. 4G. Although FIG. 4G shows three grain regions 222a, 222b and 222c, the whole portion 240 exposed by the metal layer 206 can have a single crystal grain region.

After the process mentioned with reference to FIGS. 4A–4G, the metal layer 206 is removed and the underlying amorphous silicon is also removed, thereby forming the crystalline silicon layers 112 as shown in FIG. 3D.

FIGS. 5A–5D are cross-sectional views illustrating the process steps of forming a thin film transistor using the crystalline silicon film fabricated throughout the processes of FIGS. 3A–3D and 4A–4G of the present invention.

Figure 5A:
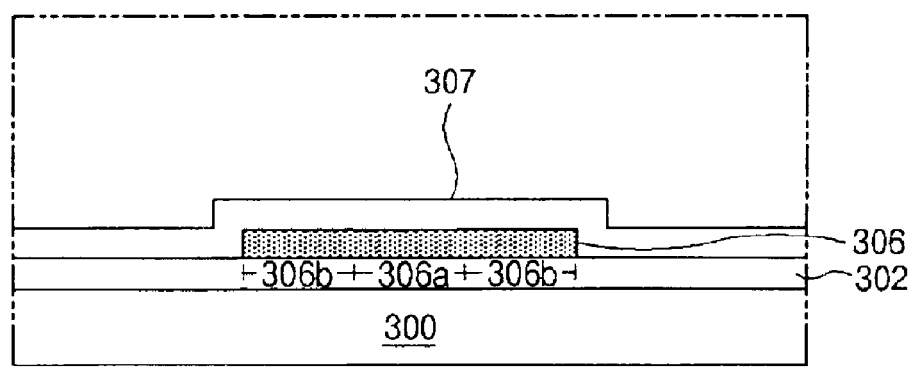
FIGS. 5A–5D are cross-sectional views illustrating the process steps of forming a thin film transistor using the crystalline silicon film of the present invention.

In FIG. 5A, a buffer layer 302 is formed on a substrate 300. And a crystalline silicon pattern 306 is formed through the above-mentioned processes in a TFT region where a thin film transistor will be formed later. The crystalline silicon pattern 306 has an island shaped on the buffer layer 302. The crystalline silicon pattern 306 is divided into an active area 306a and source and drain areas 306b. The source and drain areas 306b are disposed in both sides of the active area 306a. Next, an insulating material 307 of silicon nitride or silicon oxide is formed on the buffer layer 302 to cover the crystalline silicon pattern 306.

Figure 5B:
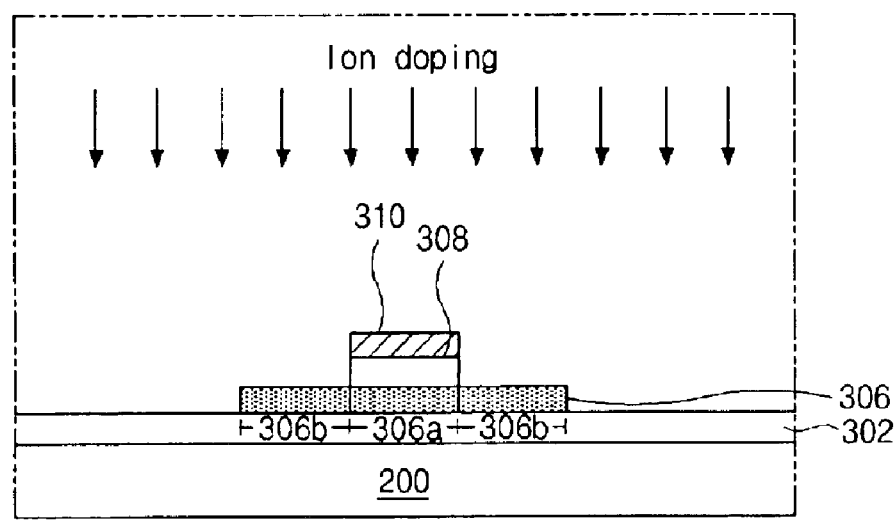

In FIG. 5B, a conductive material of metal is deposited on the insulating material 307. Thereafter, the conductive material and the insulating material 307 are simultaneously patterned, thereby sequentially forming the gate insulating layer 308 and a gate electrode 310 on the crystalline silicon pattern 306, especially on the active area 306a. After that, impurities such as p-type or n-type ions are doped on the exposed portions of the crystalline silicon pattern 306, especially on the source and drain areas 306b. At this time of doping the impurities, the gate electrode 310 acts as an ion stopper that prevents the impurities from penetrating into the active area 306a.

After doping, the source and drain areas 306b where the impurities are doped may be annealed to activate the ions doped in the source and drain regions 306b. Meanwhile, a process for restoring the source and drain regions 306b to polycrystalline state may be required because the semiconductor structures in the source and drain regions 306b may change from polycrystalline state into amorphous state due to ion doping energy. If the conventional annealing process is used to restore the source and drain regions 306b to the polycrystalline state, the annealing process may be performed under high temperatures for a long time, and thus the substrate may be transformed. To solve the problem, a process using a laser may be performed. Not only the doped ions may be activated but also the source and drain regions 306b being amorphous may be restored to the crystalline state through the process using the laser.

Figure 5C:
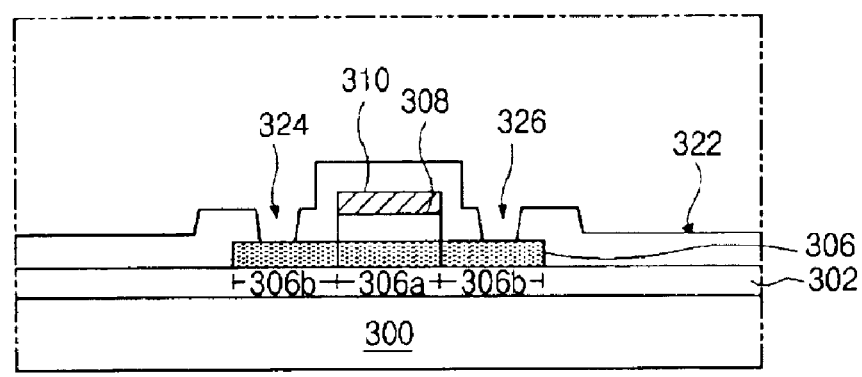

In FIG. 5C, an interlayer 322 is formed on the entire surface of the substrate 300 to cover the gate electrode 310 and the gate insulating layer 308. Then, the interlayer 322 is patterned to form first and second contact holes 324 and 326 exposing the source and drain areas 306b, respectively. The interlayer 322 may include one of silicon oxide and silicon nitride.

Figure 5D:
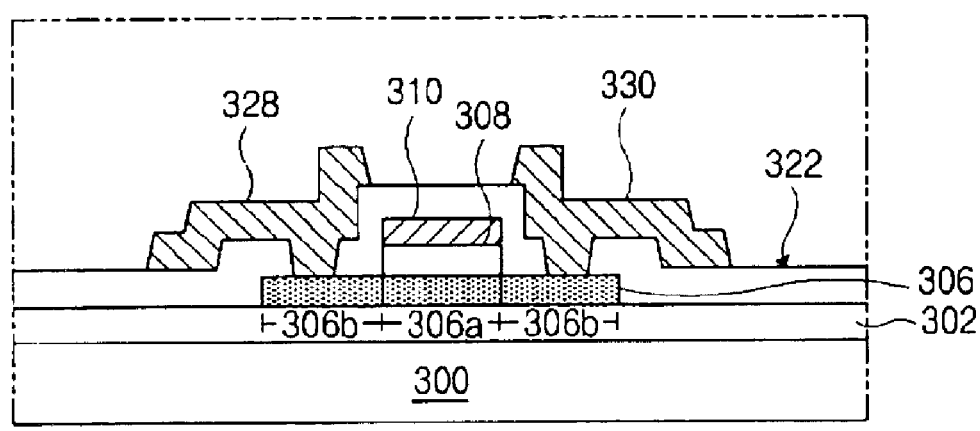

In FIG. 5D, a metal layer is deposited on the interlayer 322 and then patterned, thereby forming a source electrode 328 and a drain electrode 330. The source electrode 328 contacts the source region 306b through the first contact hole 324, and the drain electrode 330 contacts the drain region 306b through the second contact hole 326. The source and drain electrodes 328 and 330 constitute a thin film transistor with both the gate electrode 310 and the crystalline silicon pattern 306.

Meanwhile, the crystallization method described with reference to FIGS. 4A–4G uses plural laser shots to crystallize the amorphous portion exposed by the patterned metal layer. However, it may be waste of energy and time to use the plural layer shots. Two laser shots may be possible to form the polycrystalline active layer for use in the thin film transistor. Now, two-laser-shot method will be explained with reference to FIGS. 6A–6G.

FIGS. 6A–6D are cross-sectional views illustrating in detail the crystallization process step of FIG. 3C according to another exemplary of the present invention.

Figure 6A:
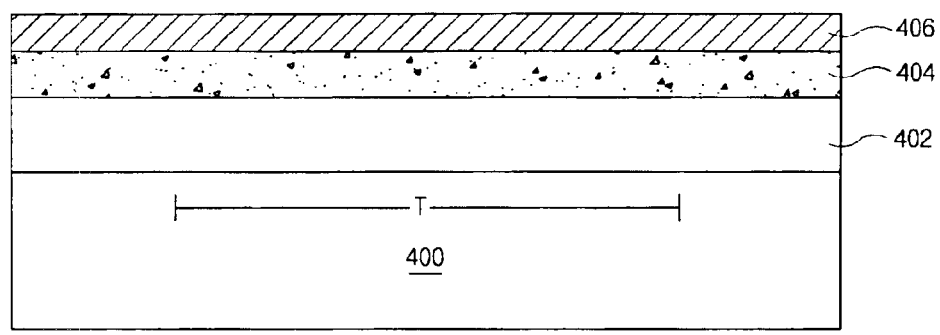
FIGS. 6A–6D are cross-sectional views illustrating in detail the crystallization process step according to another exemplary of the present invention.

In FIG. 6A, a buffer layer 402 is formed on a substrate 400. The buffer layer 402 is an inorganic material selected from silicon nitride ($SiN_x$) and silicon oxide ($SiO_2$), and acts to prevent diffusion of impurities from the substrate 400 to the later formed amorphous silicon film. An amorphous silicon (a-Si:H) layer 404 is formed on the buffer layer 402. The amorphous silicon layer 404 is usually deposited on the buffer layer 402 using chemical vapor deposition (CVD). Unfortunately, that method produces amorphous silicon with a lot of hydrogen. To reduce the hydrogen content, the amorphous silicon layer 404 is typically thermal-treated, which causes de-hydrogenation, which results in a smoother surface on the crystalline silicon film. If the de-hydrogenation is not performed, the surface of the crystalline silicon film is rough and the electrical characteristics of the crystalline silicon film are degraded.

After forming the amorphous silicon layer 404, a metal layer 406 is formed on the amorphous silicon layer 404. The metal layer 406 should have a high melting point, higher than the melting point of silicon or other semiconductor being processed, so that the metal will stand up to the processing temperatures without melting. Such a metal will generally include molybdenum (Mo) or a molybdenum alloy.

Figure 6B:
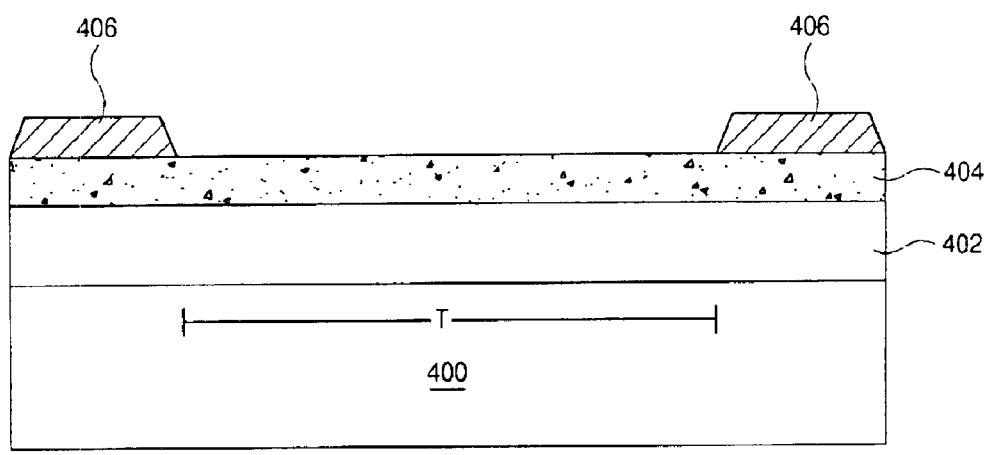

Next in FIG. 6B, the metal layer 406 is patterned to expose a portion of the amorphous silicon layer 404 which corresponds to a thin film transistor (TFT) region T.

Figure 6C:
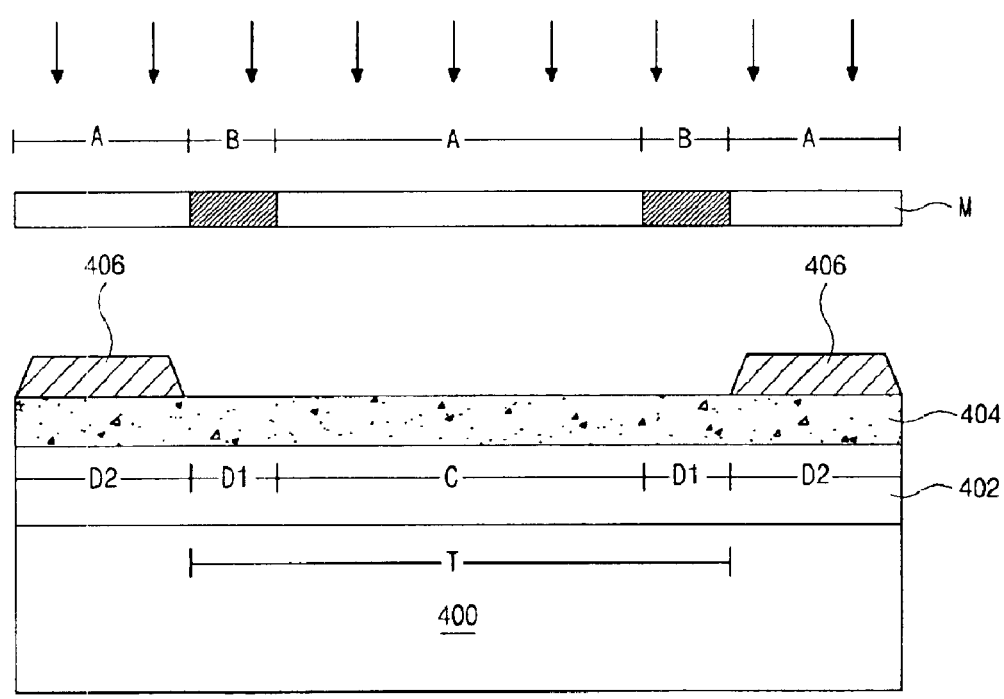

In FIG. 6C, a mask M having light transmitting areas A and light absorptive areas B is located over the patterned metal layer 406. And then a first laser beam irradiation is performed through the mask M. Unlike the mask shown in FIG. 4C, the mask M of FIG. 6C has the light transmitting area A whose width is larger than the light absorptive area B (i.e., A>B). For example, if the opening of the metal layer 406 has a width of 8 micrometers, the light transmitting area A has a width of 5–6 micrometers and the light absorptive area B has a width of 1.5 to 5 micrometers. The laser beam passing through the mask M completely melts a portion C of the amorphous silicon layer 404 which corresponds in position to the light transmitting area A of the mask M. Furthermore, since the laser beam is blocked by the light absorptive areas B and by the metal layer 406, portions D1 and D2 corresponding to the light absorptive areas B and the metal layer 406, respectively, are not melted and crystallized. Thus, after the first laser beam irradiation, the silicon layer 404 includes the completely melt region C and first and second non-melt regions D1 and D2. The completely melt region C becomes crystallized, and the non-melt regions D1 and D2 remain as amorphous silicon as they were.

Figure 6D:
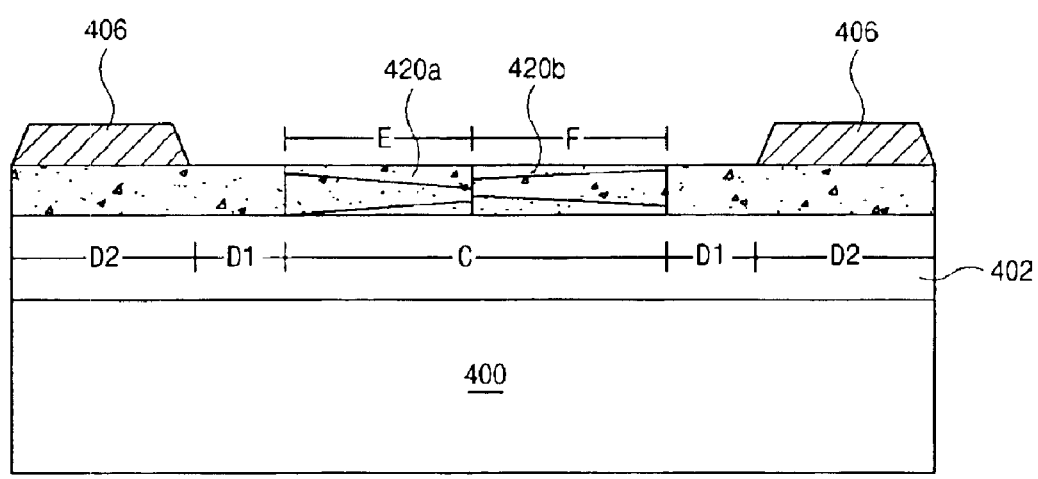

Next in FIG. 6D, the completely melt region C of the silicon layer 404 is rapidly crystallized, so that grains 420a and 420b laterally grow. Namely, lateral grain growth of the grains 420a and 420b proceeds from the first non-melt regions D1 to the fully melt region C. At this time, the first non-melt regions D1 act as seeds for crystallization. The first grains 420a laterally growing on left and the second grains 420b laterally growing on right collide with each other in a center of the melt region C. Therefore, each melt region C has a first grain region E and a second grain region F after the first laser irradiation.

Figure 6E:
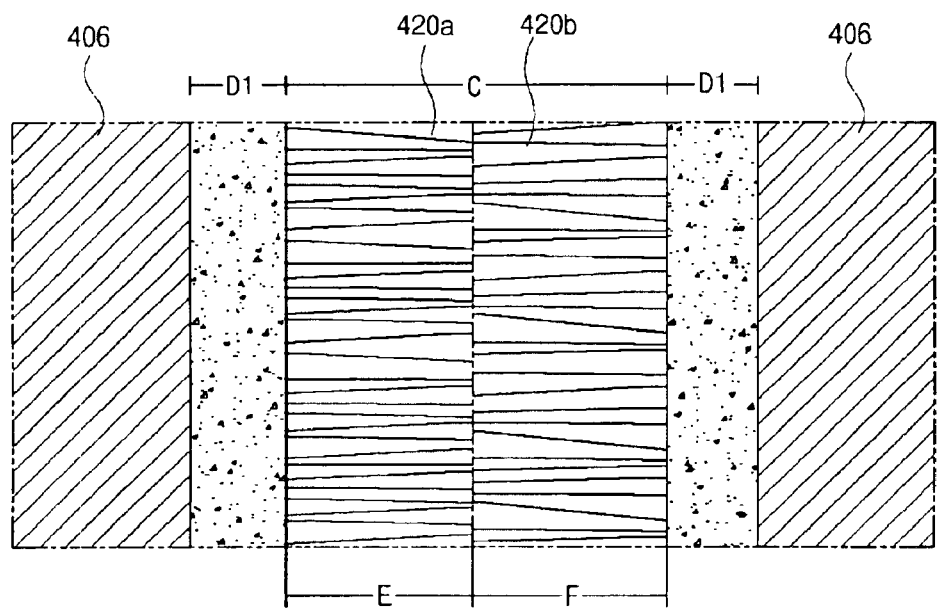
Figure 6F:
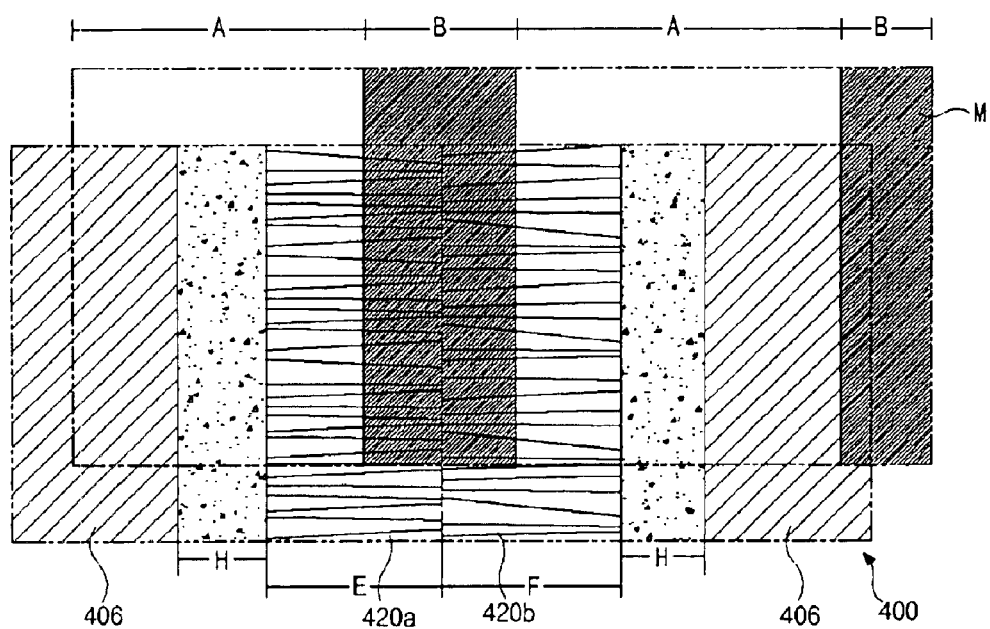
Figure 6G:
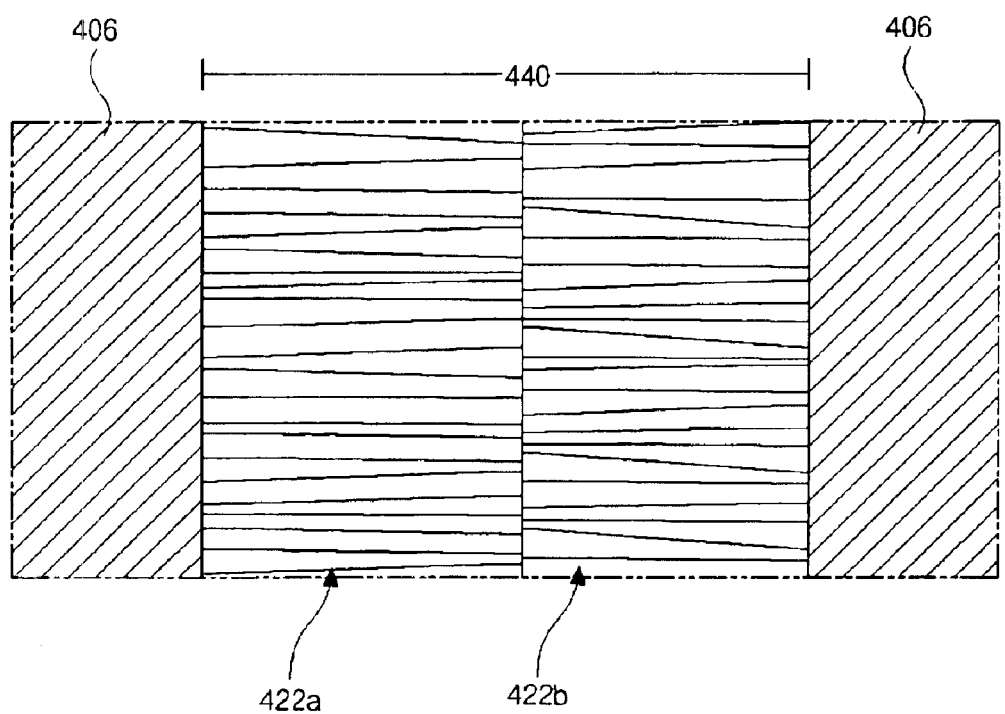

FIGS. 6E–6G are plan views showing the lateral grain growth using the SLS method after the first irradiation of FIGS. 6A–6D according to the present invention.

FIG. 6E is a plan view of FIG. 6D. As described above, the melt regions C is divided into the first and second grain regions E and F after the first laser irradiation, and the first and second grain regions E and F have the first and second grains 420a and 420b, respectively, growing from left to right and right to left. Furthermore, grain boundaries of the first and second grain regions E and F tend to form perpendicular to the interface between the melt region C and the first non-melt regions D1.

FIG. 6F illustrates a second laser beam irradiation. After the first laser beam irradiation, the mask M or the substrate 400 moves in a direction along the lateral grain growth of the grains 220a or 220b, i.e., in the X direction, by a distance that is more than the length of the laterally growing grains 420a. Thus, the light absorptive area B should cover the interface between the first and second grain regions E and F, and the light transmitting areas A on both sides of the light absorptive area B expose portions of first and second grain regions E and F and new amorphous silicon portion H. Then, a second laser beam irradiation is conducted.

Namely, in order to grow the grains, the mask M or the substrate 400 moves (relative to the amorphous silicon) to a position where the light transmitting area(s) A exposes the portions of the first and second grain regions E and F, and a new amorphous silicon portion H. Those irradiated portions are melted and then rapidly crystallized, so that the first and second grains 420a and 420b laterally grow until they collide with the oppositely growing grains.

Accordingly, by the aforementioned two-laser shot irradiation using the mask M of FIG. 6C and the metal layer 406, the amorphous silicon exposed by the metal layer 406 is fully crystallized as shown in FIG. 6G. Whole silicon portion 440 exposed by the metal layer 406 has two grain regions 422a and 422b that are formed throughout the two-laser shot method. After the process mentioned with reference to FIGS. 6A–6G, the metal layer 406 is removed and the underlying amorphous silicon is also completely removed, thereby forming the crystalline silicon layers 112 as shown in FIG. 3D.

According to the SLS method of the present invention, since the metal layer is used in crystallizing the amorphous silicon, the TFT can have more stable operating characteristics without the optical unevenness. Furthermore according to the present invention, the product efficiency increases and the yields of manufacturing also increase. The liquid crystal display device adopting the present TFT will have a high display quality.

It will be apparent to those skilled in the art that various modifications and variations can be made in the method of crystallizing the amorphous silicon without departing from the spirit or scope of the inventions. It is therefore intended that the foregoing detailed description be regarded as illustrative rather than limiting, and that it be understood that it is the following claims, including all equivalents, that are intended to define the spirit and scope of this invention.

What is claimed is:

1. A method of crystallizing an amorphous semiconductor film using a mask with a transmitting portion, the method comprising:

forming an amorphous semiconductor layer over a substrate;

forming a metal layer on the amorphous semiconductor layer;

patterning the metal layer to expose a portion of the amorphous semiconductor layer;

disposing the mask over the portion of the amorphous semiconductor layer exposed by the metal layer; and irradiating the portion of the amorphous semiconductor layer exposed by the metal layer using a beam that passes through the transmitting portion of the mask such that the portion of the amorphous semiconductor layer is crystallized.

2. The method according to claim 1, wherein the mask has a shielding portion that shields the amorphous semiconductor layer from the beam.

3. The method according to claim 1, wherein irradiating the portion of the amorphous semiconductor layer is performed using a laser beam.

4. The method according to claim 1, further comprising forming a buffer layer over the substrate and the amorphous semiconductor layer over the buffer layer.

5. The method according to claim 1, further comprising performing dehydrogenation to remove hydrogen from the amorphous semiconductor layer.

6. The method according to claim 1, wherein the metal layer has a melting point temperature higher than a semiconductor processing temperature.

7. The method according to claim 1, wherein the metal comprises molybdenum.

8. The method according to claim 1, wherein the patterning of the metal layer exposes the portion of the amorphous semiconductor layer for forming a thin film transistor.

9. The method according to claim 1, further comprising irradiating the portion of the amorphous semiconductor layer such that laterally growing grains are formed in a first grain region and a second grain region.

10. The method according to claim 9, wherein the irradiating further comprises performing a beam irradiation on a region exposed by the transmitting portion of the mask such that a first grain in the first grain region grows until the first grain collides with an oppositely growing grain in the second grain region.

11. The method according to claim 10, further comprising repositioning the mask and the substrate relative to one another by a distance less than a maximum length of a laterally growing grain.

12. The method according to claim 11, wherein the repositioning further comprises repositioning the mask and the substrate relative to one another such that the transmitting portion of the mask exposes a portion of the first grain region, an interface between the first grain region and the second grain region, the second grain region and a remaining portion of the amorphous semiconductor layer exposed by the metal layer.

13. The method according to claim 12, further comprising repeating said repositioning and said performing of the beam irradiation until the remaining portion of the amorphous semiconductor layer exposed by the metal layer is completely crystallized.

14. The method according to claim 13, further comprising removing the metal layer after completely crystallizing the exposed portion of the amorphous semiconductor layer.

15. The method according to claim 14, further comprising removing a non-crystallized portion of the amorphous semiconductor layer.

16. The method according to claim 15, further comprising forming the crystalline semiconductor layer into an active region of a thin film transistor.

17. A method of forming a polycrystalline silicon thin film transistor, comprising:

forming an amorphous silicon layer over a substrate;

forming a metal layer on the amorphous silicon layer;

patterning the metal layer to expose a portion of the amorphous silicon layer in an area where the polycrystalline silicon thin film transistor is to be formed;

disposing a mask over the portion of the amorphous silicon layer exposed by the metal layer, the mask having a light transmitting portion;

irradiating the portion of the amorphous silicon layer exposed by the metal layer using a laser beam that passes through the light transmitting portion of the mask such that the portion of the amorphous silicon layer is crystallized and laterally growing grains are formed;

removing the metal layer after crystallizing the exposed portion of the amorphous silicon layer;

removing the amorphous silicon layer such that a crystalline silicon layer remains, corresponding to the polycrystalline silicon thin film transistor, the crystalline silicon layer including an active region in a middle and a source region and a drain region sandwiching the active region;

forming a gate insulating layer on the crystalline silicon layer;

forming a gate electrode on the gate insulating layer above the active region;

doping the source and drain regions of the crystalline silicon layer;

forming an interlayer over the substrate to cover the gate electrode and the source and drain regions, the interlayer having a first contact hole and a second contact hole exposing the source and drain regions, respectively; and forming a source electrode and a drain electrode, wherein the source electrode contacts the source region through the first contact hole and the drain electrode contacts the drain region through the second contact hole.

18. The method according to claim 17, further comprising forming a buffer layer over the substrate and forming the amorphous silicon layer over the buffer layer.

19. The method according to claim 17, further comprising performing dehydrogenation to remove hydrogen from the amorphous silicon layer.

20. The method according to claim 17, wherein the metal layer has a higher melting point temperature than a silicon processing temperature.

21. The method according to claim 17, wherein the metal layer comprises molybdenum.

22. The method according to claim 17, further comprising repositioning of the mask and the substrate in relation to one another in by a distance less than a maximum length of the laterally growing grains such that the light transmitting portion exposes a portion of a previously crystallized region and a region of the amorphous silicon layer exposed by the metal layer.

23. The method according to claim 22, further comprising repeating said repositioning and said performing the laser beam irradiation until all of the amorphous silicon layer exposed by the metal layer is crystallized.

24. The method according to claim 17, wherein the irradiating further comprises performing irradiation on the area where the polycrystalline silicon thin film transistor is to be formed multiple times in different regions such that grains in a previously crystallized region grow until the grains in the previously crystallized region collide with oppositely growing grains in a newly irradiated region.

25. The method according to claim 17, wherein the doping further comprises implanting ions in the source and drain regions using the gate electrode to prevent the ions from penetrating the active region.

26. A method of forming a polycrystalline silicon thin film transistor, comprising:

forming an amorphous silicon layer over a substrate;

forming a metal layer on the amorphous silicon layer;

patterning the metal layer to expose a portion of the amorphous silicon layer in an area where the polycrystalline silicon thin film transistor is to be formed;

disposing a mask over the portion of the amorphous silicon layer exposed by the metal layer, the mask having a light transmitting portion and a light absorptive portion, wherein the light transmitting portion has a width larger than the light absorptive portion; and irradiating the portion of the amorphous silicon layer exposed by the metal layer using a laser beam that passes through the light transmitting portion of the mask such that the portion of the amorphous silicon layer is crystallized and laterally growing grains are formed.

27. The method according to claim 26, further comprises forming a buffer layer over the substrate and forming the amorphous silicon layer over the buffer layer.

28. The method according to claim 26, further comprising performing dehydrogenation to remove hydrogen from the amorphous silicon layer.

29. The method according to claim 26, wherein the metal layer has a melting point temperature higher than a silicon processing temperature.

30. The method according to claim 26, wherein the metal layer comprises molybdenum.

31. The method according to claim 26, further comprising repositioning of the mask and the substrate relative to one another by a distance larger than a maximum length of the laterally growing grains such that the light absorptive portion of the mask covers a center region of the lateral growing grains and the light transmitting area exposes a portion of a previously crystallized region and the rest of the amorphous silicon layer exposed by the metal layer.

32. The method according to claim 31, wherein the irradiating further comprises performing irradiation on the area where the polycrystalline silicon thin film transistor is to be formed in different regions such that the grains in a previously crystallized region grow until the grains in the previously crystallized region collide with oppositely growing grains in a newly irradiated region.

33. The method according to claim 31, further comprising repeating said repositioning and said performing of the laser beam irradiation two times so that all of the amorphous silicon layer exposed by the metal layer is crystallized.

34. The method according to claim 26, further comprising removing the metal layer after crystallizing the exposed portion of the amorphous silicon layer.

35. The method according to claim 34, further comprising removing the amorphous silicon layer such that the crystalline silicon layer remains corresponding to the polycrystalline silicon thin film transistor, the crystalline silicon layer including an active region in a middle and a source region and a drain region sandwiching the active region.

36. The method according to claim 35, further comprising forming a gate insulating layer on the crystalline silicon layer.

37. The method according to claim 36, further comprising forming a gate electrode on the gate insulating layer above the active region.

38. The method according to claim 37, further comprising doping the source and drain regions of the crystalline silicon layer.

39. The method according to claim 38, wherein the doping further comprises implanting impurities in the source and drain regions using the gate electrode to prevent the ions from penetrating the active region.

40. The method according to claim 38, further comprising forming an interlayer over the substrate to cover the gate electrode and the source and drain regions, the interlayer having a first contact hole and a second contact hole exposing the source and the drain regions, respectively.

41. The method according to claim 40, further comprising forming a source electrode and a drain electrode, wherein the source electrode contacts the source region through the first contact hole and the drain electrode contacts the drain region through the second contact hole.

* * * * *